(12) United States Patent
Ezzeddine et al.

(10) Patent No.: US 8,427,241 B2
(45) Date of Patent: Apr. 23, 2013

(54) HIGH EFFICIENCY, HIGH FREQUENCY AMPLIFIERS

(75) Inventors: Amin Ezzeddine, Germantown, MD (US); Ho C. Huang, Potomac, MD (US)

(73) Assignee: AMCOM Communications, Inc., Gaithersburg, MD (US)

( * ) Notice: Subject to any disclaimer, the term of this patent is extended or adjusted under 35 U.S.C. 154(b) by 0 days.

(21) Appl. No.: 13/068,905

(22) Filed: May 24, 2011

(65) Prior Publication Data

US 2012/0299658 A1   Nov. 29, 2012

(51) Int. Cl.
*H03F 3/04* (2006.01)
(52) U.S. Cl.
USPC .......................................... 330/311; 330/310
(58) Field of Classification Search .............. 330/124 R, 330/295, 302, 310, 311
See application file for complete search history.

(56) References Cited

U.S. PATENT DOCUMENTS

| | | | | |
|---|---|---|---|---|
| 3,177,437 | A | * | 4/1965 | Wood .............................. 330/10 |
| 3,443,238 | A | * | 5/1969 | Fynn et al. .................... 330/311 |
| 4,688,267 | A | * | 8/1987 | Chown et al. ................. 398/214 |
| 6,137,367 | A | * | 10/2000 | Ezzedine et al. .............. 330/311 |
| 7,551,036 | B2 | * | 6/2009 | Berroth et al. ................ 330/311 |
| 7,960,772 | B2 | * | 6/2011 | Englekirk ...................... 257/303 |
| 8,111,104 | B2 | * | 2/2012 | Ahadian et al. ............... 330/290 |

* cited by examiner

*Primary Examiner* — Henry Choe
(74) *Attorney, Agent, or Firm* — Michael de Angeli

(57) ABSTRACT

The invention is an improvement in microwave and millimeter wave amplifiers. Capacitors are connected in parallel with the source and drain terminals of all of the amplifying elements in a series of such elements except the first, compensating for current leakage due to gate capacitance. This results in improved synchronism of the amplifying elements, and improved overall efficiency and circuit performance.

29 Claims, 14 Drawing Sheets

Figure 1: Prior Art

HIGH EFFICIENCY, HIGH FREQUENCY AMPLIFIERS

FIELD OF THE INVENTION

This application is directed to improvements in amplifiers intended for use at high frequencies, e.g., up to 90 GHz and beyond, which exhibit higher efficiency than the prior art.

BACKGROUND OF THE INVENTION

In U.S. Pat. No. 6,137,367 (the "'367 patent"), the present inventors disclose certain improvements in high-power amplifiers which result in improved impedance matching to the typical load and thus improved efficiency. The present application discloses further improvements which result in still better efficiency, particularly at higher frequencies, e.g., 3 GHz up to millimeter wave frequencies.

SUMMARY OF THE INVENTION

According to the present invention, capacitors of specific values are connected in parallel with the drain and source terminals of each of the field-effect transistors ("FETs") connected in series according to the '367 patent, except the first thereof. This results in improved synchronization of the FETs, which results in improved efficiency.

More specifically, it is well known that semiconductor devices have unique values for voltage and current swing at which they deliver maximum power and efficiency. Choosing the correct ratio of the voltage and current swing values sets the optimum load, yielding the best power from a single device. If each of the series-connected FETs of an amplifier is to deliver its best power, all the FETs must experience the same voltage swing and current swing; moreover, they all should be in synchronism to work as a perfect power combiner. Unfortunately each FET has a small leakage current due to the gate capacitance. This small current increases with frequency, causing a gradual decrease in the current swing in each successive FET. The capacitors added between the drain and source of each FET according to the invention act as a current compensation mechanism to keep the current swing equalized among all the FETs in the series configuration.

BRIEF DESCRIPTION OF THE DRAWINGS

The invention will be better understood if reference is made to the accompanying drawings, in which:

FIG. 9, comprising

FIG. 11, comprising

DETAILED DESCRIPTION OF THE PREFERRED EMBODIMENT

Figure 1:
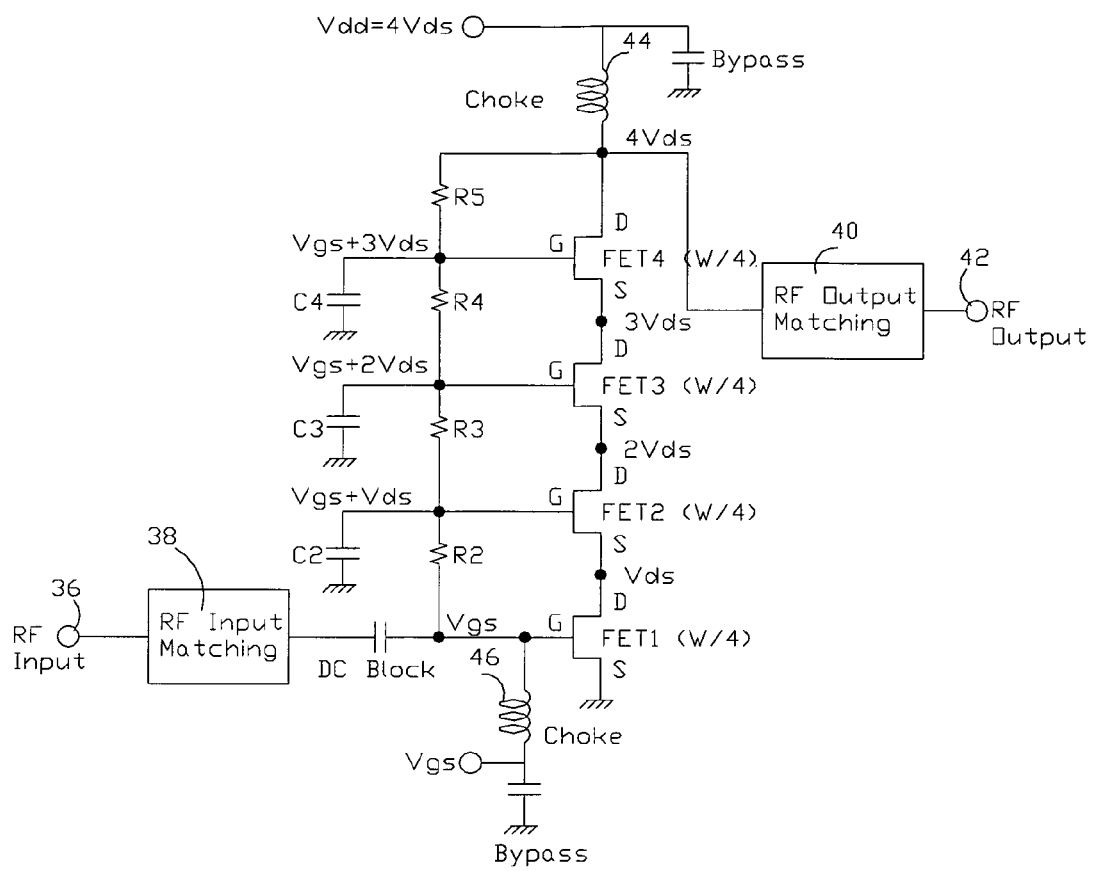
FIG. 1 is a schematic diagram of the prior art amplifier, as described in the '367 patent.
Figure 2:
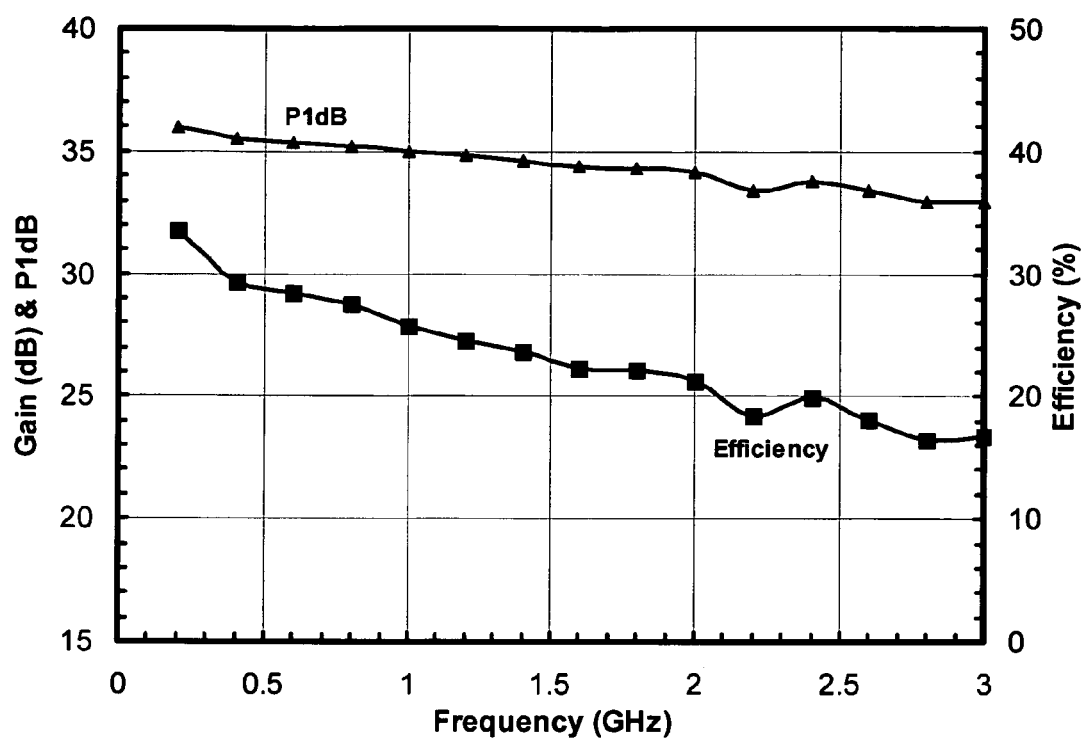
FIG. 2 is a graph showing the gain and efficiency of the prior art amplifier of FIG. 1, as functions of frequency.

FIG. 1 shows the circuit shown in FIG. 2 of the '367 patent, which is incorporated herein by this reference. This prior art circuit is referred to herein as a high-voltage high-power (HiVP) amplifier. In the implementation shown, four essentially identical FETs, FET1-FET4, are connected in series, with the drain terminal D of FET1 connected directly to the source terminal S of FET2, and the drain terminal D of FET2 connected directly to the source terminal S of FET3, and so on. The input signal is connected to the amplifier at an input terminal 36, and passes through a single input matching network 38 to the gate terminal G of the first transistor FET1 in the series. The drain terminal D of FET4, the last transistor in the series, is connected through a single output matching network 40 to the output terminal 42 of the amplifier. The output signal from FET4 is also fed back via series-connected resistors R2-R5 to the gate terminals G of each of FETs 1-4. Capacitors C2-C4 adjust the impedance of each of the corresponding transistors FET2-FET4.

It will be appreciated that in the circuit of FIG. 1, amplification of the RF input signal takes place in series fashion; that is, the input signal is successively amplified in sequence by each of transistors FET1-FET4. Feedback provided between the drain of the last transistor FET4 in the series and the gates of all the transistors FET1-FET4 by way of the series-connected resistors R2-R5 provides DC bias for the gates and helps linearity and matching at low RF frequencies. The amplifier circuit itself thus becomes the power combining element. More particularly, the series connection of the transistors effectively sums their power outputs and their output impedances to a degree to allow efficient power transfer to a high-impedance load; no RF output combiner is required. As the input signal is applied only to the gate terminal G of the first transistor FET1 in the series, only a single input matching circuit 38 is required; similarly, as the output is taken directly from the drain terminal of the last transistor FET4, only a single output matching circuit 40 is needed.

As mentioned above, FIG. 1 of this application shows the so-called "high-voltage high-power (HiVP)" embodiment of the amplifier of the '367 patent. The present invention relates to an improvement on the HiVP amplifier. The present invention is pertinent to both the high-voltage embodiment of the amplifier shown in FIGS. 2 and 3 of the '367 patent as well as the low-voltage embodiment thereof shown in FIG. 5 of the '367 patent.

Figure 3:
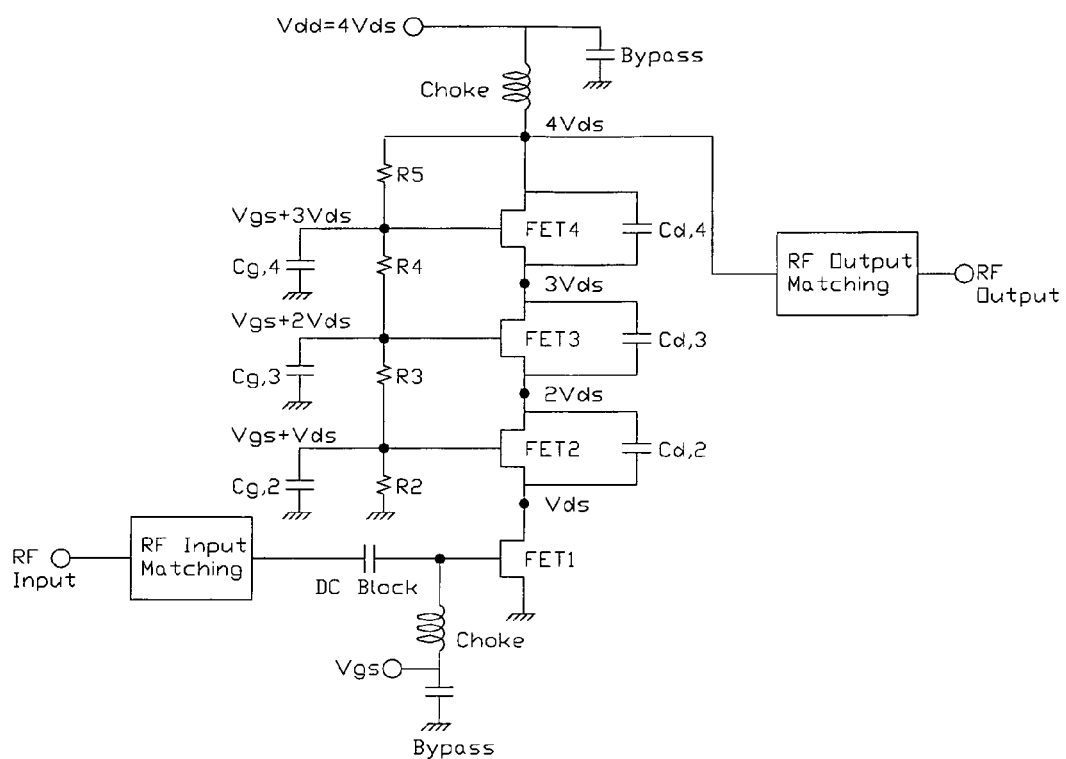
FIG. 3 is a schematic diagram of the improved amplifier according to the invention.

As discussed in the '367 patent, the HiVP embodiment of FIGS. 2 and 3 of the '367 patent is preferred where a relatively high supply voltage $V_{dd}$ of 24-40 V is available, as typically provided aboard satellites. The bias voltage $V_{ds}$ across the drain and source terminals of typical amplifying elements, such as FETs, FET1-FET4, is limited to 6-10 V for GaAs devices. Accordingly, the supply voltage $V_{dd}$ is divided by series-connected resistors R2-R5, such that a suitable drain-to-source voltage $V_{ds}$ is "seen" by each transistor. It will be appreciated that the points at which adjoining FETs are connected are not connected to ground, but "float" at voltage levels $V_{ds}$, $2V_{ds}$, $3V_{ds}$ and so on (measured with respect to ground), determined by the values of bias resistors R2-R5. That is, series-connected resistors R2-R5 serve as a voltage-dividing network, providing appropriate bias voltage to the gate of each of FETs 1-4.

The bias supply $V_{dd}$ for the top FET drain and the bias supply $V_{gs}$ for the gate of FET1 are connected to the circuit through chokes 44 and 46, such that high-frequency input signal components are not dissipated. More particularly, the string of series-connected resistors R2-R5 is also separated from $V_{dd}$ and $V_{gs}$ by these chokes 44, 46, respectively; this allows this string of series-connected resistors R2-R5 to carry the feedback signal. That is, in the absence of chokes 44, 46, the RF feedback signal would be dissipated by the $V_{dd}$ and $V_{gs}$ connections. As noted above, thus driving FETs 1-4 by the output signal fed back as a control signal allows FETs 1-4 essentially to behave as a single amplifying element, with summed power and output impedance. However, it is to be noted that this feedback connection is only useful at lower frequencies, e.g., <1 Ghz.

The present invention, termed the Universal High-Voltage/High-Power FET ("U-HiVP") is an improvement over the HiVP shown in the '367 patent, especially at microwave and millimeter wave frequencies. The circuit according to this invention dramatically improves the power, efficiency, and linearity of the circuit of the '367 patent. This new invention uses an additional simple compensation technique to extend the concept to simultaneously bias a GaAs FET (or any of several other types of semiconductor device) at high voltage while at the same time maintaining the optimum output matching impedance of close to 50 Ohms at any microwave or millimeter wave frequency. This was not possible with the original HiVP at microwave frequencies greater than 3 GHz. This new feature of the device is a major improvement and results in higher device power and efficiency while not adding undue complexity to the simple amplifier design of the '367 patent. This concept can be applied to various types of semiconductor amplifier elements in additional to the devices such as the GaAs MESFETs principally discussed herein, such as those known to the art as pHEMTs, HBTs, GaN HEMTs, CMOS or bipolar transistors, and silicon MOSFETs, to combine the power of several devices to achieve higher power output at microwave and millimeter-wave frequencies. Another improvement according to the present invention is to connect R2 to ground, not to the gate of FET1. This arrangement eliminates the DC leakage current from the positive supply voltage $V_{dd}$ to the voltage source of the gate bias for FET1.

As known to those of skill in the art, microwave-frequency semiconductor devices are traditionally biased at relatively low voltages. Several techniques have been used in the past to bias several devices in series to raise the operating voltage. The HiVP circuit shown in the '367 patent was conceived to simultaneously raise the operating voltage of the semiconductor devices and efficiently combine their individual power to achieve high power levels not possible with conventional devices. The HiVP concept was applied successfully.

However, the HiVP circuit suffers from decreased power level and efficiency at frequencies above a few GHz due to the lack of synchronism of the devices at high frequencies. The present invention adds a simple compensation to the existing HiVP configuration to effectively synchronize the phase of each of the FETs of the circuit resulting in improved power and efficiency.

This new invention has all the advantages of the HiVP at low microwave frequencies, and extends these advantages to higher microwave and millimeter-wave frequencies.

As noted for the HiVP configuration, the new U-HiVP configuration of the invention is also applicable to any bipolar or field effect transistor technology including but not limited to GaAs MESFET, GaAs pHEMT, GaAs HBT, GaN HEMT, silicon MOSFET and SiGe bipolar devices.

As mentioned above, FIG. 1 illustrates the original HiVP FET configuration as described in the '367 patent where several GaAs FETs are connected in series, allowing the bias voltage to be raised from around 6-10 volts to around 24-40 volts. The design, analysis and operation of the FIG. 1 circuit are discussed in detail in the '367 patent. The main function of the resistor divider network comprising R2-R5 is to provide the correct gate bias for the corresponding FET, and the function of the capacitors C2-C4 connecting each FET gate to ground is to adjust the impedance level at each FET drain to its optimum impedance.

The following, from the '367 patent, describes the process employed in designing the embodiment of the HiVP circuit of FIGS. 2 and 3 thereof. It is repeated here for convenience, and is employed identically in the design of circuits according to the present invention, with the additional capacitors mentioned above then added; the calculation of their values is then given below.

Following is an example of the process of designing a HiVP circuit according to the invention [of the '367 patent], that is, in the high-voltage embodiment of FIG. 2 [of the '367 patent], and a comparison of this design with a conventional design achieving the same power. FIG. 3 [of the '367 patent] shows the component values thus determined.

Assume that the total FET periphery (a measure of the total heat-dissipating capacity of the circuit) available is W, that each cell bias voltage is $V_{ds}$, and that the saturation current is $I_{dss}$ per unit periphery. For an HiVP consisting of N cells in series with the same total device periphery W (i.e., unit cell periphery is W/N) the important design parameters are as follows:

1—Total drain bias $V_{dd}=N*V_{ds}$, where $V_{ds}$ is the desired FET drain-to-source bias
2—Individual drain voltages are: $V_{ds}$, $2V_{ds}$, $3V_{ds}$, ... $NV_{ds}$
3—Individual gate voltages are: $V_{gs}$, $V_{gs}+V_{ds}$, $V_{gs}+2V_{ds}$, ... $V_{gs}+(N-1)V_{ds}$
4—Total series current is: $0.5\ I_{dss}*W/N$, where $I_{dss}$ is the saturation current per unit gate periphery
5—Maximum current swing is: $0.5\ I_{dss}*WN$
6—Maximum voltage swing is: $N*(V_{ds}-V_{knee})$, where $V_{knee}$ is the FET knee voltage. (Note that the breakdown voltage in each cell should be greater than $2V_{ds}-V_{knee}$)
7—Maximum power output: $P_{max}=0.25(V_{ds}-V_{knee})I_{dss}W$
8—Optimum load impedance: $Z_{opt}=2N^2(V_{ds}-V_{knee})/(I_{dss}W)$
9—Output impedance of each cell should be designed to have the following values: $Z_{opt}/N$, $2Z_{opt}/N$, ... $(N-1)Z_{opt}/N$, $Z_{opt}$
10—Input impedance is that of a unit cell FET with width W/N As mentioned above, another important feature of the circuit of the invention [of the '367 patent] is the provision of capacitors C2-C4, between the gates of the floating FETs and ground. These capacitors play an important role in adjusting the impedance level "seen" by the drains of each transistor FET1-FET3. This impedance adjustment is important in realizing the optimum power output from each cell.

More specifically, as above, $Z_{opt}$ is the optimum impedance needed at the drain terminal of each FET cell. Consequently, for the four-cell high-voltage embodiment of the invention shown in FIG. 2 [of the '367 patent], the optimum impedance at the drain of FET1 should be $Z_{opt}$, at the drain of FET2 it should be $2Z_{opt}$, at the drain of FET3 it should be $3Z_{opt}$, and at the drain of FET4 it should be $4Z_{opt}$. Capacitors C2, C3 and C4 are instrumental in adjusting these impedance levels. The impedance at the source input of each FET is approximately equal to:

$$Z_{source} = 1/g_m * (C_{gs} + C_{shunt})/C_{shunt}$$

where $Z_{source}$ is equal to the source input impedance of each FET
$g_m$ is the FET cell transconductance
$C_{gs}$ is the gate-to-source FET cell capacitance
$C_{shunt}$ is the shunt capacitance between gate and ground (i.e. C2, C3 or C4).
Capacitors C2-C4 form $C_{shunt}$ for the corresponding FETs, and their values should be chosen accordingly.
In summary, for the N-cell HiVP design according to the prior invention[of the '367 patent]:
1—Bias Voltage is $N*V_{ds}$
2—Bias Current is $0.5 \, WI_{dss}/N$
3—Maximum Class A output Power is $0.25(V_{ds}-V_{knee})WI_{dss}$
4—Optimum Drain Impedance is $2N^2 (V_{ds}-V_{knee})/W/I_{dss}$
For a conventional design, according to FIG. 1 [of the '367 patent], and employing similar FETs:
1—Bias Voltage is $V_{ds}$
2—Bias Current is $0.5 \, W \, I_{dss}$
3—Maximum Class A power output is $0.25(V_{ds}-V_{knee})WI_{dss}$
4—Optimum Drain Impedance is $2(V_{ds}-V_{knee})/W/I_{dss}$ Thus, the optimum output impedance for the HiVP according to the invention [of the '367 patent] is approximately $N^2$ larger than the impedance for a conventional design; it will be appreciated by those of skill in the art that this is a major achievement, particularly in that it permits great simplification of the output-matching requirement. Furthermore, the DC bias voltage is N times and the DC current is 1/N that of the conventional design, which reduces the $I^2 R$ losses in the DC bias circuit.

Returning now to discussion of the present invention, at low frequencies (i.e. <1 GHz) the "cells" (that is, the duplicated circuitry surrounding each of the four FETs) in the circuit of FIG. 2 of the '367 patent and repeated as FIG. 1 hereof are synchronized and the device power is the sum of the optimum power of each individual cell. However, it was observed through analysis and in actual circuit implementations that the power and efficiency drop with increased frequency. This drop in power is caused by the FET cells going out of synchronism.

The upper trace in FIG. 2 shows the broadband power of a 4-Watt monolithic microwave integrated circuit (MMIC) using the HiVP technique of the '367 patent, while the lower trace shows the efficiency, both as functions of frequency. As is apparent, both the power and efficiency drop off significantly for frequencies above 1 GHz. More specifically, and as mentioned above, it is well known that semiconductor devices have unique values for voltage and current swing at which they deliver maximum power and efficiency. Choosing the correct ratio of the voltage and current swing values sets the optimum load, yielding the best power from a single device. If each of the series-connected FETs of an amplifier is to deliver its best power, all the FETs must experience the same voltage swing and current swing; moreover, they all should be in synchronism to work as a perfect power combiner. As is well known to those of skill in the art, at microwave frequencies each FET has a small leakage current from source to gate due to the gate capacitance. This leakage current at the source of the $M^{th}$ FET (where M is 2, 3, or 4 in FIG. 3) is equal to $j\omega C_{gs} \cdot C_M/(C_{gs}+C_M) V_{M-1}$. This current is small but increases with frequency, causing a gradual decrease in the current swing in each successive FET and lack of synchronism for the voltage waveforms among the individual FETs.

FIG. 3 shows the circuit of the invention, referred to herein as the Universal High-Voltage FET (U-HiVP). This circuit restores the synchronism of the FETs of each of the cells at microwave or millimeter-we frequencies, thus restoring the power and efficiency of the combined FET cells.

As will be appreciated, the FIGS. 1 and 3 circuits differ in that in the FIG. 3 circuit of the present invention, additional capacitors $C_{d2}$, $C_{d3}$, $C_{d4}$, have been added across the source and drain terminals of each of the three FETs in the series except the first; that is, additional capacitors are connected across the FETs FET2-4. In essence, the primary function of these additional capacitors $C_{d2}$, $C_{d3}$, $C_{d4}$ is to keep FETs 2-4 synchronized with FET1, and also compensate for the leakage current mentioned above.

The addition of the compensating capacitors $C_{d2}$, $C_{d3}$, $C_{d4}$ is a simple but powerful modification to the original configuration of the '367 patent, in that it restores the synchronism of the FET cells over a very broad frequency range, making this new configuration a much more powerful technique to combine microwave semiconductor devices at any frequency.

Another modification to the circuit of FIG. 1 is that in the FIG. 3 circuit of the present invention, resistor R2 in FIG. 3 connects the gate of FET2 to ground instead of to the gate of FET1, as in FIG. 1, thus avoiding the leakage current from the positive supply voltage $V_{dd}$ to the voltage source of the gate bias for FET1. The value of R2 is set to a new value using a factor of $(V_{ds}+V_{gs})/V_{ds}$ to accommodate this variation.

Figure 7:
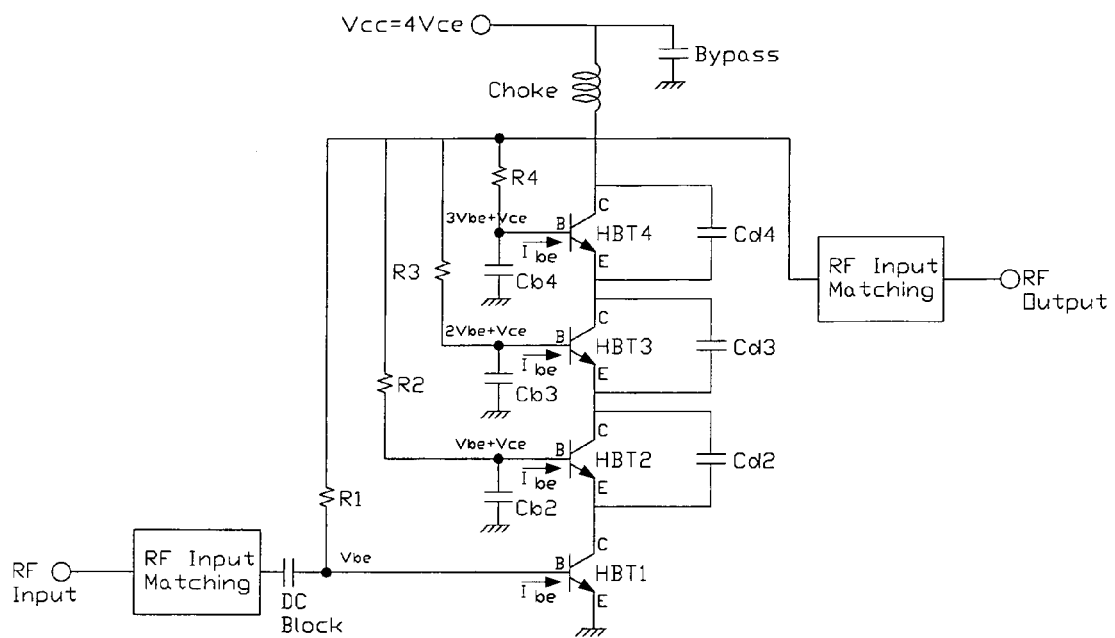
FIG. 7 is a schematic diagram of the circuit of the invention, as implemented using bipolar transistors rather than FETs.

The following mathematical analysis demonstrates how the additional capacitors improve performance. This analysis demonstrates the technique using a FET configuration; as noted above, the invention is not so limited, and the same technique is applicable to amplifiers using other semiconductor components, such as devices using CMOS, HBT or SiGe bipolar technology. As discussed, FIG. 7 shows a modification optimizing the circuit of the invention for use with bipolar devices.

Figure 4:
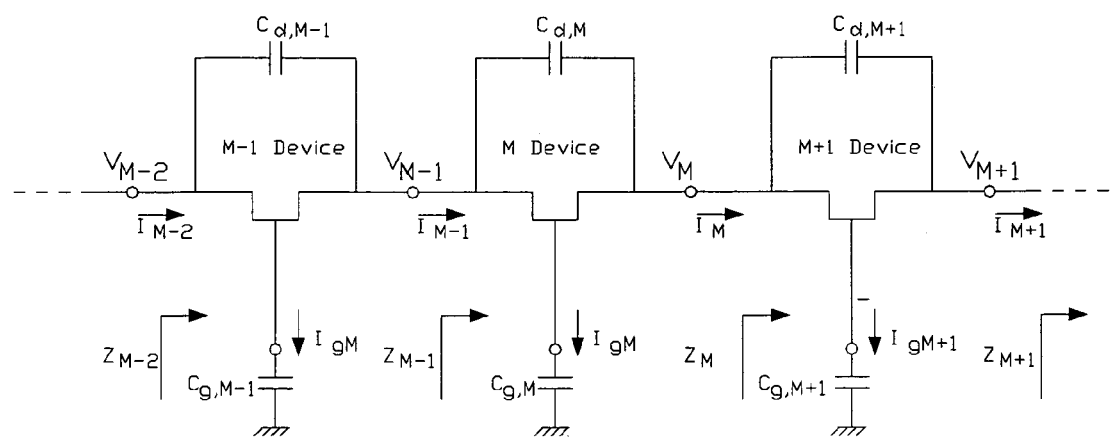
FIG. 4 is an enlarged schematic diagram of a part of the circuit of FIG. 3, showing the flow of current and variation in voltage and impedance at key points.
Figure 5:
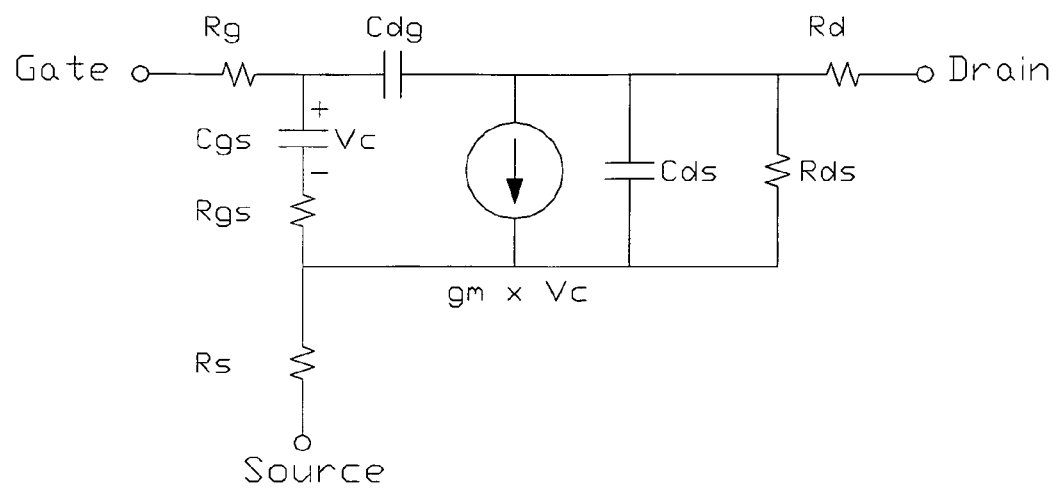
FIG. 5 is an equivalent circuit diagram of a typical FET.
Figure 6:
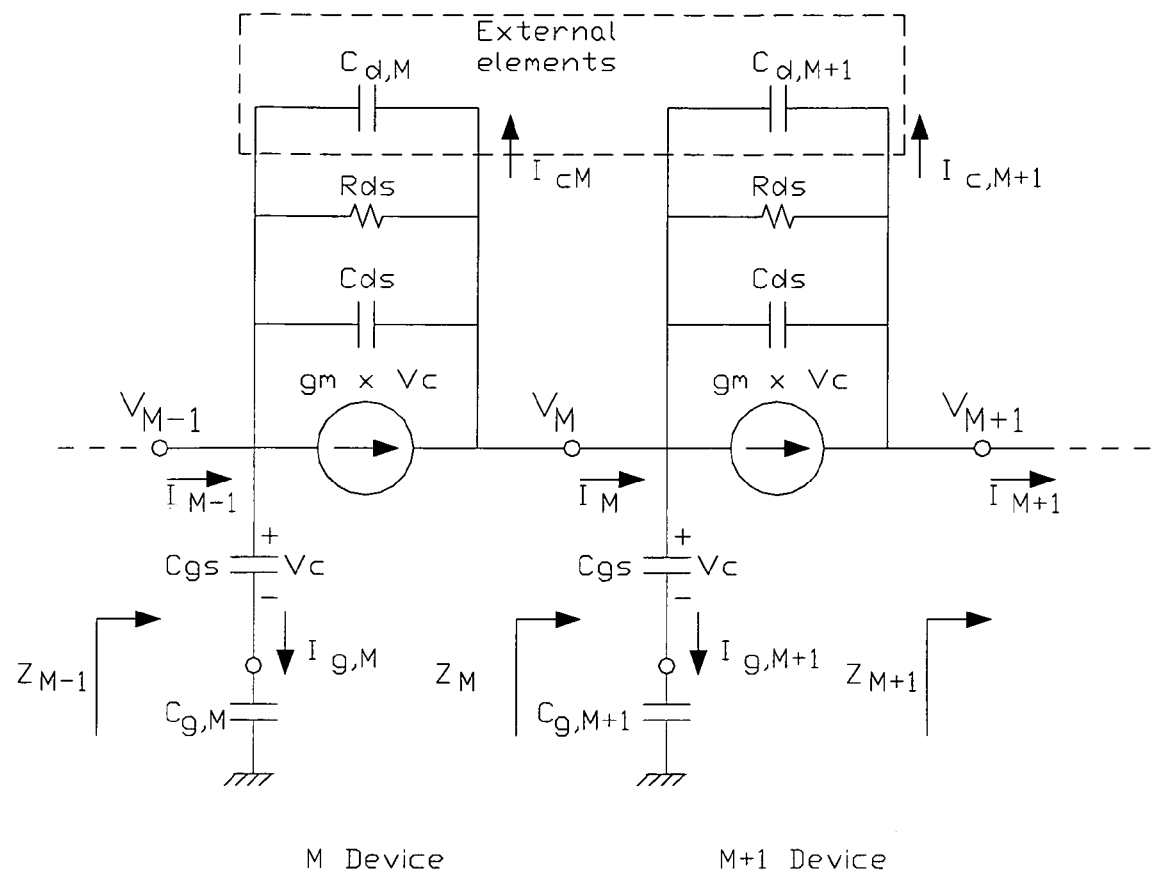
FIG. 6 is an enlarged schematic diagram of a portion of the FIG. 4 circuit, combining features of FIGS. 4 and 5.

In the following, we analyze a generalized U-HiVP configuration consisting of N devices in series as shown in FIG. 4. FIG. 5 shows the RF equivalent circuit of a typical FET, showing the voltage controlled current source $g_m \times V_c$, where $V_c$ is the voltage across the gate-to-source capacitance $C_{gs}$, and also illustrating the various stray capacitances and resistances that exist between the terminals of the device, including the gate resistance $R_g$, the gate-to-source resistance $R_{gs}$, the source resistance $R_s$, the drain-to-source resistance $R_{ds}$, the drain resistance $R_d$, the gate-to-source capacitance $C_{gs}$, the drain-to-source capacitance $C_{ds}$, and the drain-to-gate capacitance $C_{dg}$. For the sake of simplicity $R_g$, $R_d$, $R_s$, $R_{gs}$ and $C_{dg}$ will be ignored in our analysis, because they have only a small effect on device performance and can safely be ignored. The effects of these parasitic elements could easily be included in computer simulations if desired. $R_{ds}$, $C_{gs}$, and $C_{ds}$ remain relevant. FIG. 6 shows the equivalent circuit with these three parameters illustrated as to two of the cells of FIG. 4, and thus shows the RF small signal equivalent circuit of the U-HiVP.

Maximum power of an N-Cell U-HiVP can be achieved if the voltage swings across device terminals are forced to be equal for all cells; the current gain $g_m \times V_c$, and the currents flowing through the intrinsic elements in each device should also be identical for all devices. $V_c$ is the gate-to-source voltage in each individual FET. Also the $V_c$ voltage waveform should be identical for all the FETs to guarantee perfect power combining. The currents flowing through the $C_{d,M}$ compensating elements need not be the same, but are critical in restoring the device synchronism and voltage balance at microwave frequencies.

In the following, we assume that there are a total of N devices, and we analyze the $M^{th}$ device where the index M could take values from 2 to N.

Based on the above the following conditions should apply:

$$V_{M+1} - V_M = V_M - V_{M-1} = V_o \quad (1)$$

where $V_o$ is the voltage swing across the drain and source of each FET. Since all the FETs should be synchronized, by simple addition:

$$V_M = M \cdot V_o \quad (2)$$

Since by definition $V_c$ is a constant for all devices:

$$V_c = V_{gs,M} = \frac{(M-1)V_o}{1 + \frac{C_{gs}}{C_{g,M}}} \quad (3)$$

Since $V_c$, the voltage across all gate capacitors (i.e. $C_{gs,M}$) is constant, the current sources in all cells also have the same magnitude $I_o$ $$I_m = g_m V_c = g_m \frac{(M-1)V_o}{1 + \frac{C_{gs}}{C_{g,M}}} \quad (3)$$

Assume that $Y_{opt}$ is the optimum impedance needed at the drain terminal of a common source single FET (i.e. FET 1 in the U-HiVP configuration); hence, by definition:

$$Y_{opt} = (I_o - j\omega C_{ds} V_o)/V_o \quad (4)$$

Therefore $$Y_{opt} + j\omega C_{ds} = I_o / V_o \quad (5)$$

From (4) and (6):

$$Y_{opt} + j\omega C_{ds} = g_m \frac{(M-1)}{1 + \frac{C_{gs}}{C_{g,M}}} \quad (6)$$

Hence $$C_{g,M} = \frac{C_{gs}}{g_m(M-1)/(Y_{opt} + j\omega C_{ds}) - 1} \quad (7)$$

Note that for all microwave transistors $Y_{opt}$ can be approximated by a shunt resistor and a shunt negative capacitor defined as follows:

$$Y_{opt} = G_{opt} - j\omega C_{opt} \quad (8)$$

where $G_{opt}$ is the real part of $Y_{opt}$ and $\omega C_{opt}$ is the imaginary part.

Usually $C_{opt} \approx C_{ds}$ so from (7) and (8):

$$C_{g,M} = \frac{C_{gs}}{g_m(M-1)/(G_{opt} - j\omega C_{opt} + j\omega C_{ds}) - 1} \quad (9)$$

$$\cong \frac{C_{gs}}{g_m(M-1)/G_{opt} - 1}$$

Referring to FIG. 6, from Kirchhoff's current law the current $I_M$ coming from the $M^{th}$ cell is:

$$I_M = g_m V_c - (j\omega C_{d,M} + j\omega C_{ds})V_o \quad (10)$$

That same current should be sinking into the $(M+1)^{th}$ cell, that is:

$$I_M = g_m V_c + j\omega C_{gs} V_c - (j\omega C_{d,M+1} + j\omega C_{ds})V_o \quad (11)$$

From (10) and (11):

$$j\omega C_{d,M+1} V_o = j\omega C_{d,M} V_o + j\omega C_{gs} V_c \quad (12)$$

Equation (12) simply states that for perfect synchronization the current of the $C_{d,M+1}$ compensating capacitor provided according to the invention is needed to feed the compensating capacitor of the $M^{th}$ cell (i.e. $C_{d,M}$) and the gate current of the $(M+1)^{th}$ cell. From (12) & (3):

$$j\omega C_{d,M+1} = j\omega C_{d,M} + j\omega C_{gs} \frac{(M-1)}{1 + \frac{C_{gs}}{C_{g,M}}} \quad (13)$$

From (13) and (7):

$$j\omega C_{d,M+1} \cong j\omega C_{d,M} + j\omega C_{gs} G_{opt} / g_m \quad (14)$$

Since $C_{d,1} = 0$:

$$j\omega C_{d,M+1} \cong \frac{j\omega C_{gs}}{g_m} M G_{opt} \quad (15)$$

From (2) and (11) we can calculate the impedance presented at the drain of every cell $Z_M$:

$$Z_M = V_M / I_M \quad (16)$$

$$= \frac{MV_o}{g_m V_c - (j\omega C_{d,M} + j\omega C_{ds})V_o}$$

$$= \frac{MV_o}{I_m - (j\omega C_{d,M} + j\omega C_{ds})V_o}$$

$$\cong \frac{M}{G_{opt} - (j\omega C_{d,M} + j\omega C_{ds})}$$

Also, $Y_M$ becomes:

$$Y_M = 1/Z_M \quad (17)$$

$$\cong (G_{opt} - j\omega C_{ds})/M - j\omega C_{d,M}/M$$

$$\cong Y_{opt}/M - j\omega C_{d,N}/M$$

From (17) we deduce that the optimum impedance for an M-Cell U-HiVP is M times the optimum impedance of a single device in parallel with a negative capacitance equal to $C_{d,M}/M$.

The capacitors $C_{d,M}$ added according to the present invention to the circuit for which specific component values are given in FIG. 4 of the '367 patent are calculated from (16) as follows:

$$C_{d,2} = \frac{C_{gs}}{g_m} G_{opt}$$

$$C_{d,3} = \frac{C_{gs}}{g_m} 2 \cdot G_{opt}$$

$$C_{d,4} \cong \frac{C_{gs}}{g_m} 3 \cdot G_{opt}$$

Also from (10):

$$C_{g,2} = \frac{C_{gs}}{g_m/G_{opt} - 1}$$

$$C_{g,3} = \frac{C_{gs}}{2g_m/G_{opt} - 1}$$

$$C_{g,4} = \frac{C_{gs}}{3g_m/G_{opt} - 1}$$

The above mathematical analysis shows that the U-HiVP device circuit of this new invention has the significant advantage over the old HiVP circuit of providing excellent power and efficiency at any device operating frequency in the microwave and millimeter wave spectrum by providing substantially perfect synchronization for the series FETs at all voltages and currents.

The capacitors $C_{d,M}$ can be implemented in monolithic microwave integrated circuits (MMIC) using standard semiconductor processing technology.

FIG. 7 shows the recommended circuit for a U-HiVP device according to this new invention implemented using bipolar transistors HBT1-4 instead of FETs as in FIG. 3. The circuits are very similar, except that the voltage divider circuitry of FIG. 3 is replaced with a current divider for the different devices of FIG. 7, since the bipolar transistor is a current-controlled device. Stated differently, the FETs of the FIG. 3 circuit are voltage-controlled, and require a voltage dividing circuit (or another source of appropriate bias voltage) to supply the proper bias voltages $V_{g,M}$; the HBTs of FIG. 7 are current-controlled devices, and therefore require a current-dividing circuit to supply the proper bias currents $I_{be,M}$.

In the following, we compare the performance of the U-HiVP circuit with the HiVP circuit using simulations and actual measurements.

Figure 8:
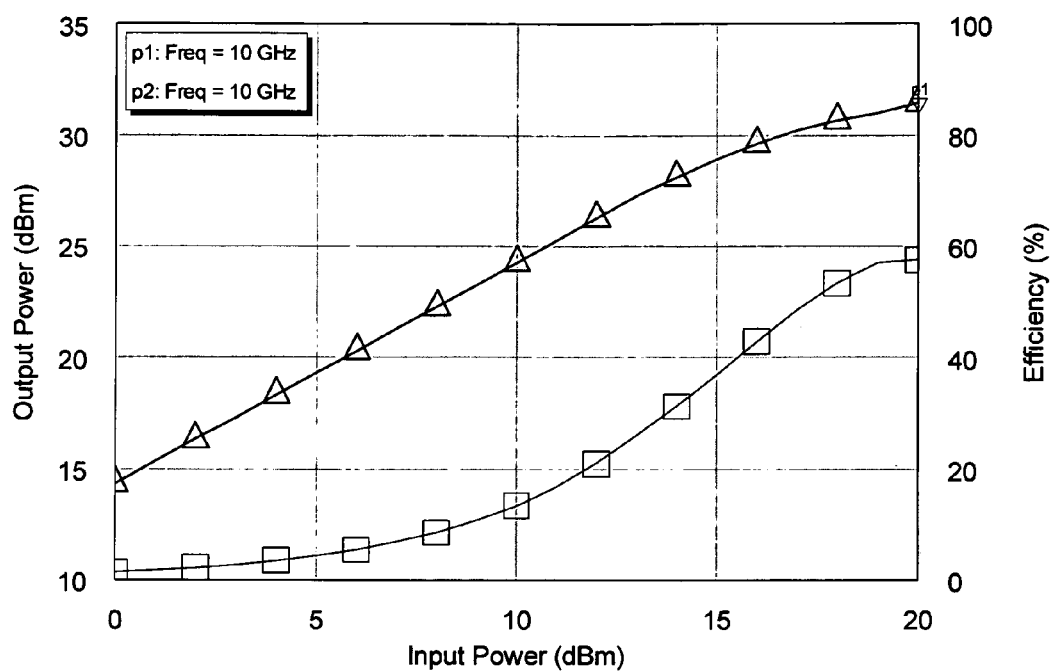
FIG. 8 is a graph showing the simulated performance of the circuit of the invention at 10 GHz.

A simulation of a 2×1 mm U-HiVP (that is, a simulation of the performance of a U-HiVP circuit implemented using 2 FETs in series with each FET having a total gate periphery of 1 mm), designed as above, was performed using AWR nonlinear simulation and a comparison made to a similar 2×1 mm HiVP circuit. FIGS. 8 and 9 show the results of simulation of the 2×1 mm U-HiVP circuit and FIGS. 10 and 11 corresponding results with respect to the old HiVP circuit. These simulations were all carried out at an assumed frequency of 10 GHz. The nonlinear FET equivalent circuit was derived using actual measurements of 0.5 μm GaAs FET process.

Figure 10:
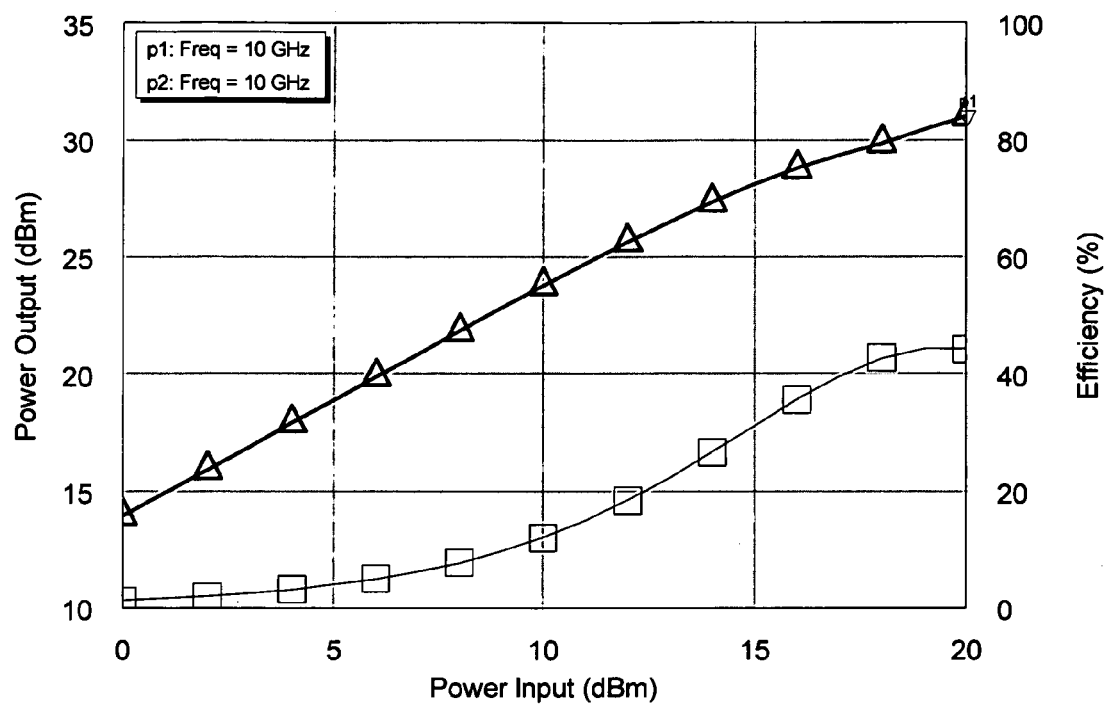
FIG. 10 is a graph comparable to FIG. 8, showing the simulated performance of the circuit of the '367 patent.

FIGS. 8 and 10 show the output power in dBm on the left vertical axis, the input power in dBm on the horizontal axis, and the efficiency in % on the right vertical axis. The trace-connecting triangles are the output power, and the trace-connecting squares are the efficiency. It will be seen that the efficiency of the new U-HiVP in FIG. 8 (58%) is significantly improved over that of the HiVP in FIG. 10 (43%).

Figure 9A:
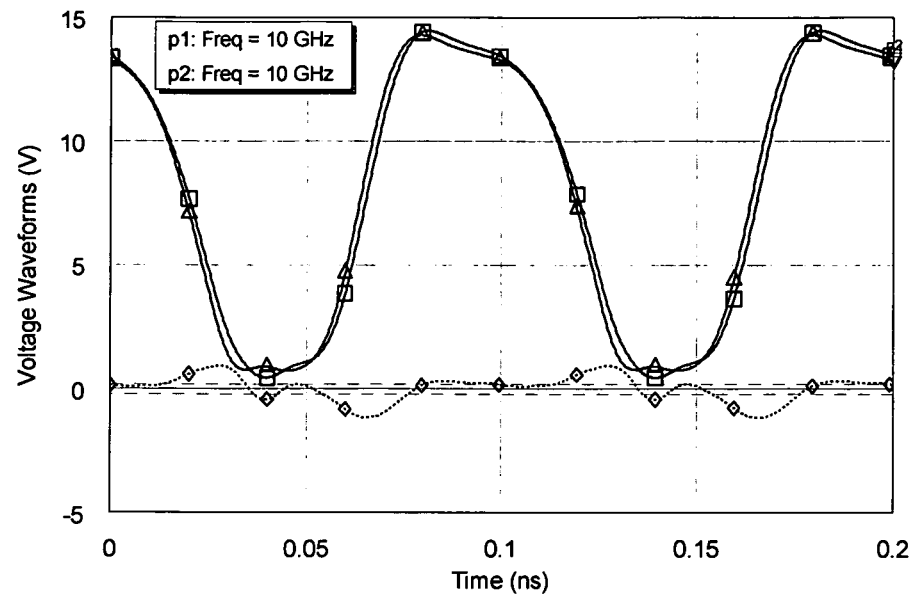
FIGS. 9a and 9b, shows respectively the simulated voltages and currents across and through two of the FETs of the circuit of the invention, as functions of time, measured at 10 GHz.
Figure 9B:
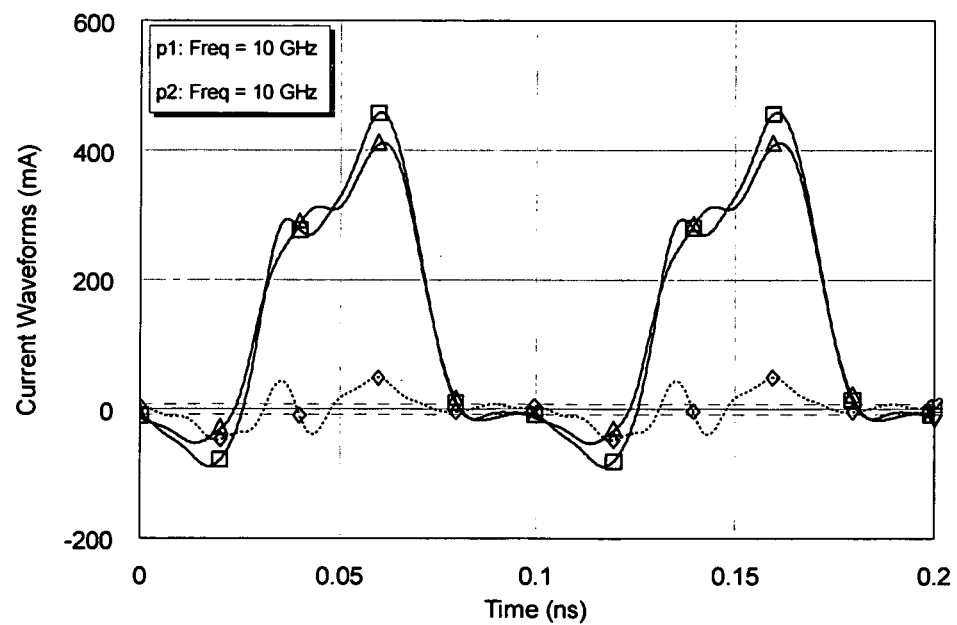
Figure 11A:
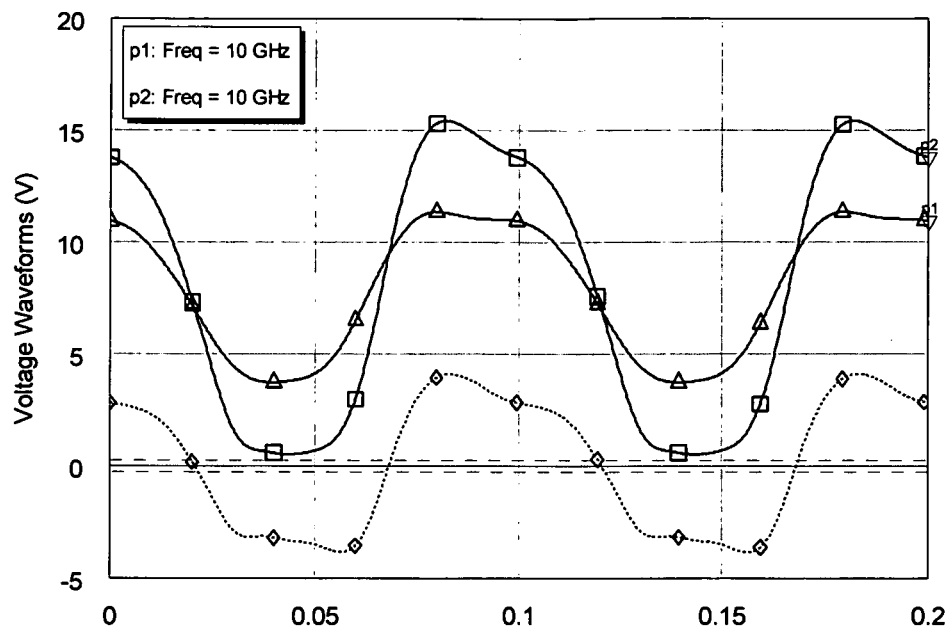
FIGS. 11a and 11b, is comparable to FIG. 9, with respect to the circuit of the '367 patent.
Figure 11B:
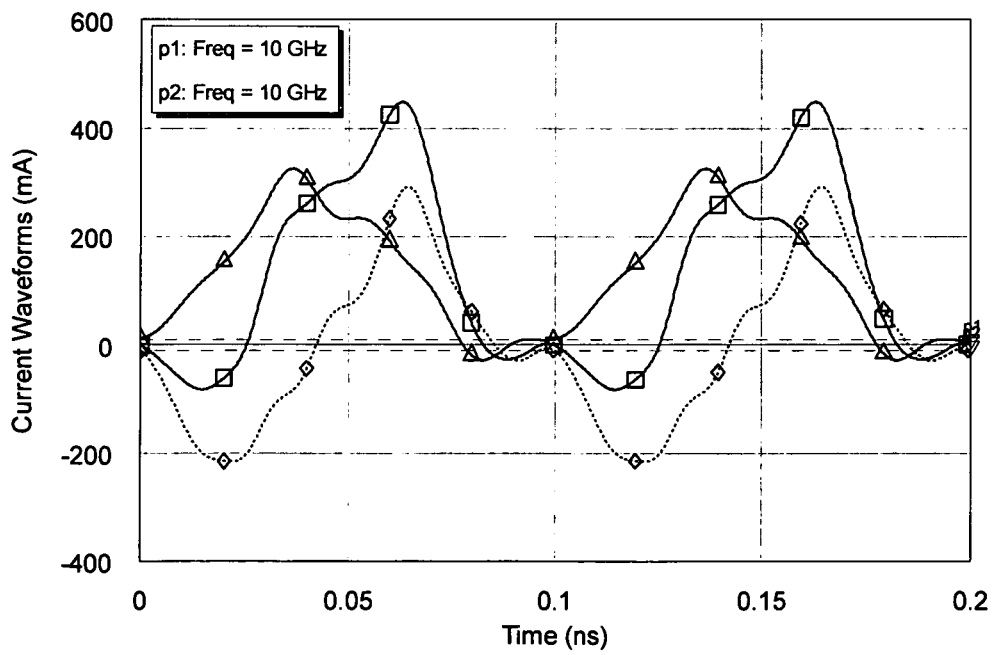

FIGS. 9a and 9b show in FIG. 9a two simulated waveforms for voltage simulated across two of the FETs of the U-HiVP circuit of the invention, and in FIG. 9b current waveforms simulated similarly. The traces connecting diamonds in FIG. 9a represent the voltage difference between the two FETs at any given time; if the synchronization were perfect, this would be zero. In FIG. 9b, the trace connecting the diamonds similarly represents the difference in current. FIGS. 11a and 11b show similar simulated waveforms with respect to the HiVP circuit. It will be observed that the FIG. 9 waveforms are much more closely correlated to one another than those of FIG. 11, showing that the U-HiVP circuit of the invention indeed performs much better—that is, more efficiently—than the HiVP circuit of the '379 patent.

Figure 12:
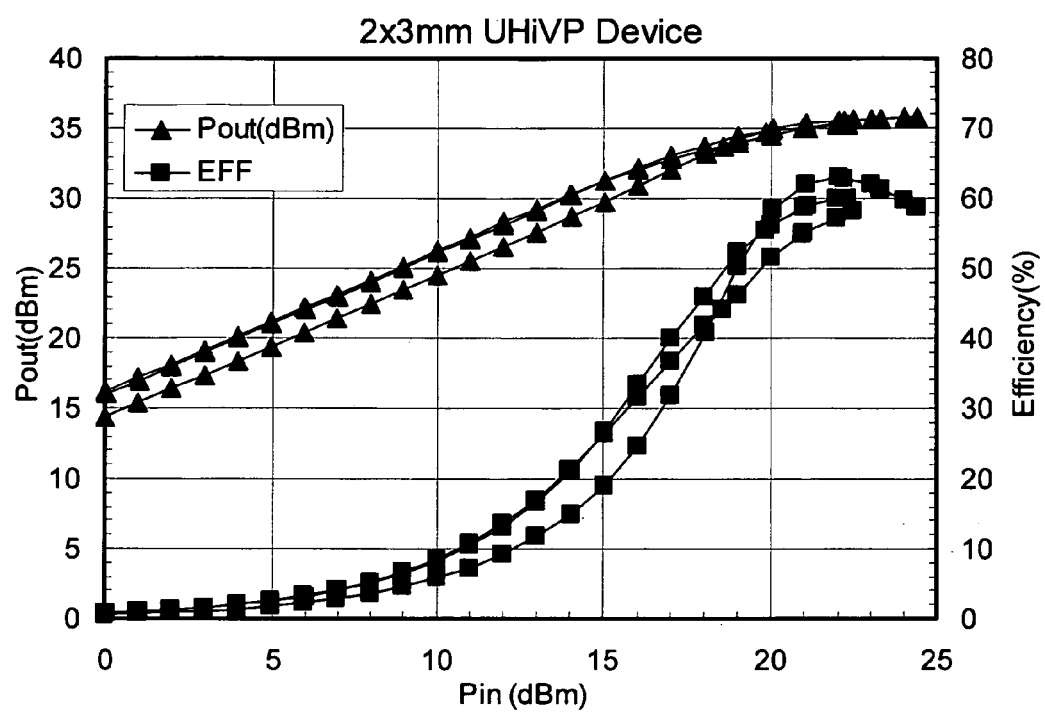
FIG. 12 is a graph showing measured gain, output power, and efficiency of the circuit of the invention, as functions of input power.
Figure 13:
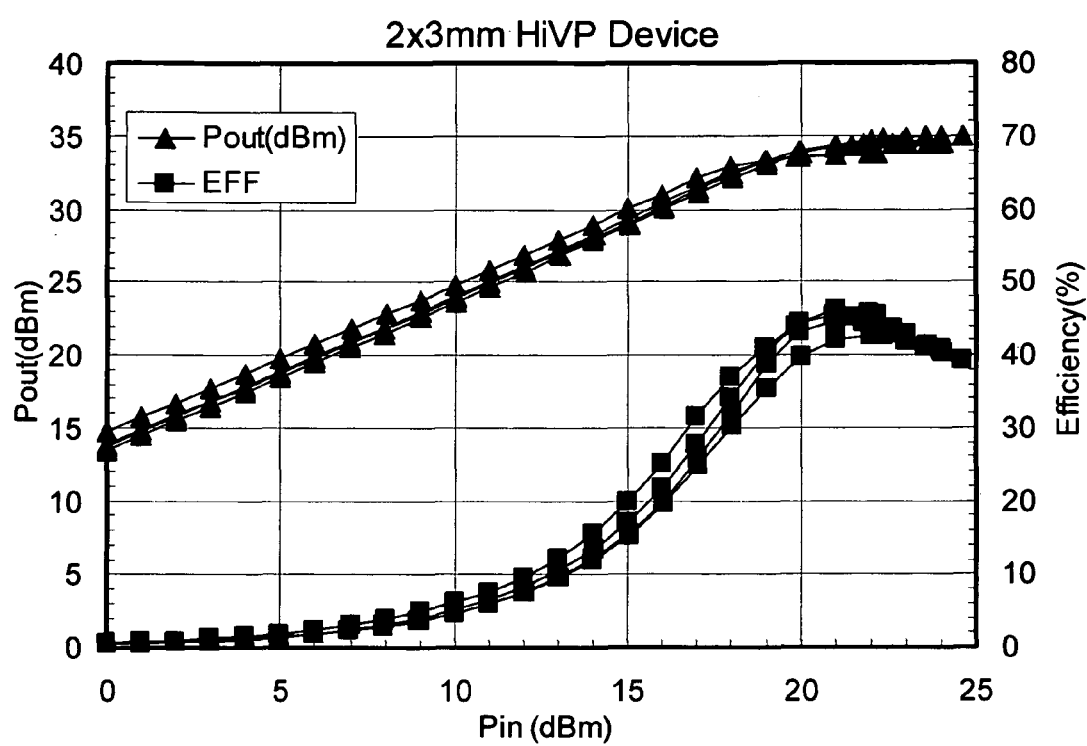
FIG. 13 is a graph comparable to FIG. 12, with respect to the circuit of the '367 patent.

Finally, two actual circuits were constructed to compare the present invention with that of the '379 patent. The FETs of each circuit were manufactured identically, using the known 0.5 μm GaAs pHEMT process. The first device is a 2×3 mm U-HiVP according to the present invention, and the second device is a 2×3 mm HiVP according to the '379 patent. FIGS. 12 and 13 compare actual power measurements taken at 7 GHz with respect to the 2×3 mm U-HiVP and the 2×3 mm HiVP, respectively. Again, similarly to FIGS. 8 and 10, the output power is shown in dBm on the left vertical axis, the input power in dBm on the horizontal axis, and the efficiency on %, on the right vertical axis. The trace-connecting triangles are the output power, and the trace-connecting squares the efficiency. As will be apparent, FIG. 12 shows output power and efficiency versus input power at optimum load at 7 GHz of the 2×3 mm U-HiVP, and that the efficiency at best power is 60%. FIG. 13 shows the best efficiency of the HiVP to be 42%. Note also that the U-HiVP output power is almost 1 dBm higher than that of the old HiVP configuration, due to the near-perfect synchronization of the FETs.

Figure 14:
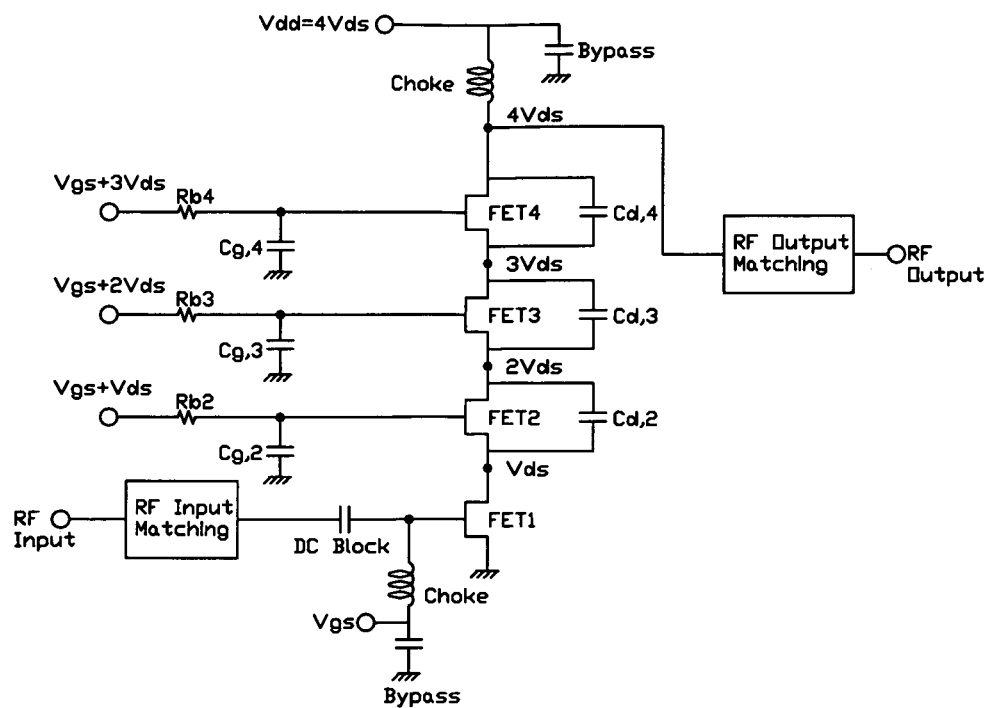
FIG. 14 shows an alternative to the circuit of FIG. 3, showing another way to bias the gates of the FETs thereof.

FIG. 14 shows an alternative method for biasing the gates of the individual FETs. As shown, here the bias voltages Vgs+Vds, Vgs+2 Vds . . . may be provided from sources other than a voltage-dividing network per se. High-valued bias resistors Rb2, Rb3, Rb4 are provided to ensure isolation, so that the RF signal does not flow to the respective sources. These bias resistors do not draw any current since the gates of the FETs are open at DC. For narrow band applications, this bias arrangement is preferred because there is no DC current following through the resistors Rb2, Rb3 . . . (as compared to the FIG. 3 embodiment), thereby improving the efficiency.

It will appreciated that the invention is not limited to providing the bias voltages (or bias currents, in the bipolar configuration) using voltage- (or current-) dividing circuitry per se, and that the feedback provided using the voltage-dividing circuitry of the '367 patent is not useful at the higher frequencies primarily addressed by the present invention.

In summary, we have disclosed a novel device/circuit configuration which can be applied to a variety of devices such as MESFET, HEMT, P-HEMT, HBT, CMOS, Silicon MOSFET and SiGe bipolar transistors to simultaneously achieve power levels not possible currently using conventional designs at any microwave or millimeter-wave frequency. The new U-HiVP configuration adds a compensation technique to the HiVP configuration of the '367 patent to combine the output powers of several FET cells and to bias the entire circuit at higher voltages than possible with a single device at microwave or millimeter-wave frequencies. Simple analysis and computer simulations confirm the advantages of this technique, as do lab measurements on a 2-cell U-HiVP.

The '367 patent also discloses, in FIG. 5, a low-voltage embodiment intended for cellular and portable telephones where only moderate power is available. Certain additional refinements are discussed in the '367 patent to adapt the basic circuit to such a low-voltage embodiment. The present invention is applicable to this embodiment as well, and the same refinements are useful therewith.

While a preferred embodiment of the invention has been disclosed in detail, the invention is not to be limited thereby, but only by the following claims.

What is claimed is:

1. An amplifier for amplifying an input signal, comprising:
a plurality of semiconductor amplifying elements, each comprising a control terminal to which a signal may be applied for controlling the flow of current between additional input and output terminals, and a source of bias voltage providing power for said amplifying elements,
said plurality of amplifying elements being connected in series, such that the output terminal of a first element of the series is connected to the input terminal of the next element of the series, and so on, the input signal being applied to the control terminal of the first element of the series, and the output terminal of the last element of the series being connected to an output circuit,
wherein capacitors are connected between the control terminals of each of the amplifying elements in the series, except the first, and ground, the value of each said capacitor being chosen to optimize the impedance of and power output by the corresponding amplifying elements;
wherein capacitors are connected in parallel across the input and output terminals of each of the amplifying elements in the series except the first, whereby current leaking due to control terminal capacitance is compensated for, and the amplifying elements operate in substantial synchronism; and
wherein the values of said capacitors connected in parallel across the input and output terminals of each of the amplifying elements in the series except the first are chosen such that the voltage swings across the corresponding amplifying elements, the current gain provided by the corresponding amplifying elements, and the current flowing through the corresponding amplifying elements are substantially equal.

2. The amplifier of claim 1, wherein the input control terminal of the first of said amplifying elements of the series is connected to a point maintained at a fixed potential through a choke, such that high-frequency input signal components are not grounded.

3. The amplifier of claim 1, further comprising an input matching network between the input terminal of said amplifier and the control terminal of the first amplifying element in said series, and an output matching network between the output terminal of the last amplifying element in the series and the output terminal of said amplifier.

4. The amplifier of claim 3, wherein said input and output matching networks comprise DC blocking capacitors.

5. The amplifier of claim 1, wherein the value $C_{g,M}$ of each of said capacitors connected between the control terminals of each of the amplifying elements in the series except the first and ground is chosen so as to optimize the impedance $Z_{M-1}$ of the corresponding amplifying element, in accordance with the following equation:

$$Z_{M-1} = (M-1)Z_{opt}$$
$$= \frac{(M-1)}{Y_{opt}}$$
$$= \frac{(M-1)}{(G_{opt} - j\omega C_{ds})}$$

Where $Z_{M-1}$ is the source input impedance of the $M^{th}$ amplifying element, $Z_{opt}$ is the optimum impedance of a single device, and $Y_{opt}$ is the optimum admittance (i.e. $1/Z_{opt}$);
and where:

$$C_{g,M} = \frac{C_{gs}}{g_m(M-1)/(G_{opt} - j\omega C_{opt} + j\omega C_{ds}) - 1}$$
$$\cong \frac{C_{gs}}{g_m(M-1)/G_{opt} - 1}$$

in which:
$g_m$, is the FET cell transconductance;
$C_{gs}$ is the gate-to-source FET cell capacitance; and
$C_{g,M}$ is the shunt capacitance between gate and ground of the $M^{th}$ element
$G_{opt}$ is the real part of $Y_{opt}$ and $-j\omega C_{opt}$ is the imaginary part of $Y_{opt}$.

6. The amplifier of claim 1, wherein said source of bias voltage is connected to the output terminal of the last of said elements in said series through a choke, and wherein said bias voltage is provided to each of said elements by voltage-dividing resistors in series across the control terminals of said elements.

7. The amplifier of claim 6, wherein said output signal is supplied to the control terminals of each of the elements of the series for feedback through the same series-connected resistors used to supply bias voltage.

8. A circuit for providing high-power, high-impedance amplification of a RF signal, comprising:
a plurality of amplifying elements, each comprising input, output, and control terminals,
said plurality of amplifying elements being connected in series, such that the output terminal of the first element in the series is connected to the input terminal of the second, and so on;
an input connection for applying a RF input signal to the control terminal of the first element in the series;
an output connection connected to the output terminal of the last element in the series, for applying an amplified RF output signal to a load;
a source of bias voltage operatively connected to each of said amplifying elements;
capacitors connected between the control terminals of each of the amplifying elements in the series except the first and ground, the value of each said capacitor being chosen to optimize the impedance of and power output by the corresponding amplifying element;
capacitors connected in parallel across the input and output terminals of each of the amplifying elements in the series except the first, whereby current leaking due to control terminal capacitance is compensated for, and the amplifying elements operate in substantial synchronism; and
wherein the values of said capacitors connected in parallel across the input and output terminals of each of the amplifying elements in the series except the first are chosen such that the voltage swings across the corresponding amplifying elements, the current gain provided by the corresponding amplifying elements, and the current flowing through the corresponding amplifying elements are substantially equal.

9. The circuit of claim 8, wherein said source of bias voltage is connected to the output terminal of the last of said elements in said series through a choke.

10. The circuit of claim 8, further comprising an input matching network between said input connection and the control terminal of the first amplifying element in said series, and an output matching network between the output terminal of the last amplifying element in the series and said output connection.

11. The circuit of claim 10, wherein said input and output matching networks comprise DC blocking capacitors.

12. The circuit of claim 8, wherein the value $C_{g,M}$ of each of said capacitors connected between the control terminals of each of the amplifying elements in the series except the first and ground is chosen so as to optimize the impedance $Z_{M-1}$ of the corresponding amplifying element, in accordance with the following equation:

$$Z_{M-1} = (M-1)Z_{opt}$$
$$= \frac{(M-1)}{Y_{opt}}$$
$$= \frac{(M-1)}{(G_{opt} - j\omega C_{ds})}$$

where $Z_{M-1}$ is the source input impedance of the $M^{th}$ amplifying element, $Z_{opt}$ is the optimum impedance of a single device, and $Y_{opt}$ is the optimum admittance (i.e. $1/Z_{opt}$).

13. The circuit of claim 8, wherein said bias voltage is provided to each of said elements by voltage-dividing resistors in series across the control terminals of said elements.

14. The circuit of claim 13, wherein said output signal is supplied to the control terminals of each of the elements of the series for feedback through the same series-connected resistors used to supply bias voltage.

15. A method for providing high-power, high-impedance amplification of an RF input signal, comprising the steps of:
    connecting a plurality of amplifying elements, each comprising input, output, and control terminals, in series, such that the output terminal of the first element in the series is connected to the input terminal of the second, and so on;
    applying an RF input signal to the control terminal of the first element in the series;
    providing bias voltage to each of said amplifying elements, such that the input RF signal is amplified in each element;
    connecting a load to the output terminal of the last element in the series, for applying an amplified RF output signal to the load; and
    wherein capacitors are connected between the control terminals of each of said amplifying elements, except the first, and ground, the value of each of said capacitors being chosen to adjust the impedance of and power output by the corresponding amplifying element;
    wherein capacitors are connected in parallel across the input and output terminals of each of the amplifying elements in the series except the first, whereby current leaking due to control terminal capacitance is compensated for, and the amplifying elements operate in substantial synchronism; and
    wherein the values of said capacitors connected in parallel across the input and output terminals of each of the amplifying elements in the series except the first are chosen such that the voltage swings across the corresponding amplifying elements, the current gain provided by the corresponding amplifying elements, and the current flowing through the corresponding amplifying elements are substantially equal.

16. The method of claim 15, wherein the value $C_{g,M}$ of each of said capacitors connected between the control terminals of each of the amplifying elements in the series except the first and ground is chosen so as to optimize the impedance $Z_{M-1}$ of the corresponding amplifying element, in accordance with the following equation:

$$Z_{M-1} = (M-1)Z_{opt}$$
$$= \frac{(M-1)}{Y_{opt}}$$
$$= \frac{(M-1)}{(G_{opt} - j\omega C_{ds})}$$

where $Z_{M-1}$ is the source input impedance of the $M^{th}$ amplifying element, $Z_{opt}$ is the optimum impedance of a single device, and $Y_{opt}$ is the optimum admittance (i.e. $1/Z_{opt}$).

17. The method of claim 16, wherein $$C_{g,M} = \frac{C_{gs}}{g_m(M-1)/(G_{opt} - j\omega C_{opt} + j\omega C_{ds}) - 1}$$
$$\cong \frac{C_{gs}}{g_m(M-1)/G_{opt} - 1}$$

where:
    $g_m$ is the FET cell transconductance;
    $C_{gs}$ is the gate-to-source FET cell capacitance;
    $C_{g,Mt}$ is the shunt capacitance between gate and ground; and
    $G_{opt}$ is the real part of $Y_{opt}$ and $-j\omega C_{opt}$ is the imaginary part of $Y_{opt}$.

18. An amplifier for amplifying an input signal, comprising:
    a plurality of bipolar transistor amplifying elements, each comprising a base terminal to which a signal may be applied for controlling the flow of current between additional input and output terminals, and a source of base current providing power for said amplifying elements, said plurality of amplifying elements being connected in series, such that the output terminal of a first element of the series is connected to the input terminal of the next element of the series, and so on, the input signal being applied to the base terminal of the first element of the series, and the output terminal of the last element of the series being connected to an output circuit,
    wherein capacitors are connected between the base terminals of each of the amplifying elements in the series except the first and ground, the value of each said capacitor being chosen to optimize the impedance of and power output by the corresponding amplifying elements;

wherein said source of base current is connected to the output terminal of the last of said elements in said series through a choke, and wherein said base current is provided to the base terminal of each of said elements by current-controlling resistors in series with the base terminals of said elements;

wherein capacitors are connected in parallel across the input and output terminals of each of the amplifying elements in the series except the first, whereby current leaking due to control terminal capacitance is compensated for, and the amplifying elements operate in substantial synchronism, and wherein the values of said capacitors connected in parallel across the input and output terminals of each of the amplifying elements in the series except the first are chosen such that the voltage swings across the corresponding amplifying elements, the current gain provided by the corresponding amplifying elements, and the current flowing through the corresponding amplifying elements are substantially equal.

19. The amplifier of claim 18, wherein the base terminal of the first of said amplifying elements of the series is connected to a point maintained at a fixed potential through a choke, such that high-frequency input signal components are not grounded.

20. The amplifier of claim 18, further comprising an input matching network between the input terminal of said amplifier and the base terminal of the first amplifying element in said series, and an output matching network between the output terminal of the last amplifying element in the series and the output terminal of said amplifier.

21. The amplifier of claim 18, wherein said input and output matching networks each comprise capacitors.

22. The amplifier of claim 18, wherein the base current is supplied separately to each of said amplifying elements.

23. The amplifier of claim 18, wherein the value $C_{g,M}$ of each of said capacitors connected between the base terminals of each of the amplifying elements in the series except the first and ground is chosen so as to optimize the impedance $Z_{M-1}$ of the corresponding amplifying element, in accordance with the following equation:

$$Z_{source} = 1/g_m * (C_{be} + C_{shunt})/C_{shunt}$$

where $Z_{source}$ is the source input impedance of each amplifying element;
$g_m$ is the bipolar element's transconductance;
$C_{be}$ is the base-to-emitter capacitance of the bipolar element; and
$C_{shunt}$ is the shunt capacitance between base and ground.

24. The amplifier of claim 1, wherein the values $C_{d,M}$ of the capacitors connected in parallel across the input and output terminals of the $M^{th}$ amplifying element in the series except the first are:

$$j\omega C_{d,M} = j\omega C_{d,M-1} + j\omega C_{gs} \frac{M-1}{1 + \frac{C_{gs}}{C_{g,M}}}$$

in which:
$C_{gs}$ is the gate-to-source FET cell capacitance; and
$C_{g,M}$ is the shunt capacitance between gate and ground of the $M^{th}$ element.

25. The amplifier of claim 1, wherein the values $C_{d,M}$ of the capacitors connected in parallel across the input and output terminals of the $M^{th}$ amplifying element in the series except the first are approximated as:

$$j\omega C_{d,M} \cong \frac{j\omega C_{gs}}{g_m}(M-1)G_{opt}$$

in which:
$g_m$ is the FET cell transconductance;
$C_{gs}$ is the gate-to-source FET cell capacitance;
$Y_{opt}$ is the optimum admittance of a single device (i.e. $1/Z_{opt}$), and $G_{opt}$ is the real part of $Y_{opt}$ and $-j\omega C_{opt}$ is the imaginary part of $Y_{opt}$.

26. The circuit of claim 8, wherein the values $C_{d,M}$ of the capacitors connected in parallel across the input and output terminals of the $M^{th}$ amplifying element in the series except the first are:

$$j\omega C_{d,M} = j\omega C_{d,M-1} + j\omega C_{gs} \frac{M-1}{1 + \frac{C_{gs}}{C_{g,M}}}$$

in which:
$C_{gs}$ is the gate-to-source FET cell capacitance; and
$C_{g,M}$ is the shunt capacitance between gate and ground of the $M^{th}$ element.

27. The circuit of claim 8, wherein the values $C_{d,M}$ of the capacitors connected in parallel across the input and output terminals of the $M^{th}$ amplifying element in the series except the first are approximated as:

$$j\omega C_{d,M} \cong \frac{j\omega C_{gs}}{g_m}(M-1)G_{opt}$$

in which:
$g_m$ is the FET cell transconductance;
$C_{gs}$ is the gate-to-source FET cell capacitance;
$Y_{opt}$ is the optimum admittance of a single device (i.e. $1/Z_{opt}$), and
$G_{opt}$ is the real part of $Y_{opt}$ and $-j\omega C_{opt}$ is the imaginary part of $Y_{opt}$.

28. The method of claim 15, wherein the values $C_{d,M}$ of the capacitors connected in parallel across the input and output terminals of the $M^{th}$ amplifying element in the series except the first are:

$$j\omega C_{d,M} = j\omega C_{d,M-1} + j\omega C_{gs} \frac{M-1}{1 + \frac{C_{gs}}{C_{g,M}}}$$

in which:
$C_{gs}$ is the gate-to-source FET cell capacitance; and
$C_{g,M}$ is the shunt capacitance between gate and ground of the $M^{th}$ element.

29. The method of claim 15, wherein the values $C_{d,M}$ of the capacitors connected in parallel across the input and output terminals of the $M^{th}$ amplifying element in the series except the first are approximated as:

$$j\omega C_{d,M} \cong \frac{j\omega C_{gs}}{g_m}(M-1)G_{opt}$$

in which:

$g_m$, is the FET cell transconductance;
$C_{gs}$ is the gate-to-source FET cell capacitance;
$Y_{opt}$ is the optimum admittance of a single device (i.e. $1/Z_{opt}$), and
$G_{opt}$ is the real part of $Y_{opt}$ and $-j\omega C_{opt}$ is the imaginary part of $Y_{opt}$.

* * * * *